US005768173A

United States Patent [19]

Seo et al.

[11] Patent Number: 5,768,173

[45] Date of Patent: Jun. 16, 1998

[54] MEMORY MODULES, CIRCUIT SUBSTRATES AND METHODS OF FABRICATION THEREFOR USING PARTIALLY DEFECTIVE MEMORY DEVICES

[75] Inventors: Seung Jin Seo, Kyungdi-do; Kug Sang Lee, Suwon, both of Rep. of Korea

[73] Assignee: Samsung Electronics Co., Ltd., Suwon, Rep. of Korea

[21] Appl. No.: 744,440

[22] Filed: Nov. 8, 1996

[30] Foreign Application Priority Data

Nov. 11, 1995 [KR] Rep. of Korea .................. 1995-40846
Nov. 11, 1995 [KR] Rep. of Korea .................. 1995-40847

[51] Int. Cl.$^6$ .................. G11C 5/06

[52] U.S. Cl. .................. 365/52; 365/63; 365/230.03

[58] Field of Search .................. 365/51, 52, 63, 365/230.03

[56] References Cited

U.S. PATENT DOCUMENTS 5,319,591 6/1994 Takeda et al. .................. 365/63
5,414,670 5/1995 Schaefer .................. 365/230.03
5,572,457 11/1996 Michael .................. 365/52

*Primary Examiner*—Joseph A. Popek
*Attorney, Agent, or Firm*—Myers Bigel Shibley & Sajovec

[57] ABSTRACT

A memory module includes a plurality of memory devices, each memory device including a plurality of memory cell arrays, a plurality of data input/output lines, and a memory cell array select input line. The plurality of memory cell arrays are arranged as a plurality of blocks such that data transfer is enabled between a memory cell array in each block of the plurality of blocks and a respective data input/output line of the plurality of data input/output lines when a predetermined voltage is applied to the memory cell array select input line. The module includes a circuit substrate on which the plurality of memory devices is mounted, the circuit substrate including first and second voltage busses. Means are provided for selectively connecting the memory cell array select input lines of the plurality of memory devices to the first and second voltage busses such that a predetermined voltage is applied to the memory cell array select input lines of the plurality of devices and data transfer is enabled between a selected memory cell array in each block of each memory device and a respective data input/output line of the memory device. Preferably, the selected memory cell arrays are free of defective memory cells, and memory devices of the plurality of memory devices have defective cells in memory cell arrays other than the selected memory cell arrays.

17 Claims, 6 Drawing Sheets

MEMORY MODULES, CIRCUIT SUBSTRATES AND METHODS OF FABRICATION THEREFOR USING PARTIALLY DEFECTIVE MEMORY DEVICES

FIELD OF THE INVENTION

The present invention generally relates to semiconductor memory devices, more particularly, to memory modules, circuit substrates for memory modules, and fabrication methods therefor.

BACKGROUND OF THE INVENTION

In recent years, the production of increasingly integrated dynamic random access memory (DRAM) devices such as 16 Megabit (M) DRAM and 64M DRAM devices has generally resulted in decreasing device production yields due to the smaller feature size and complexity of these devices. Although many memory devices may pass pre-laser and electrical die sorting (EDS) tests, devices may be still be rejected through burn-in test and reliability tests such as pressure cooker test (PCT) or temperature cycling (T/C) after being packaged. Even if a memory device is found to have just one defective memory cell among millions of cells, it typically is not shipped to customers.

Generally, an increasing proportion of semiconductor memory devices are being discarded due to the presence of defective memory cells after packaging. This problem may become exacerbated in the future as the capacity of memory devices increases to 1 gigabit (G) or more. The increase in the number of failed devices generally leads to increased production costs, as there generally is no conventional use for the defective memory devices. A significant percentage of these failed devices have only a single defective cell, with some estimates putting this percentage at about 7% of the total number of memory devices produced, or approximately 90% of all rejected devices.

FIG. 1 is a schematic diagram of a conventional memory module, as described in European Patent Publication No. 0 395 612, applicant International Business Machines Co. Memory devices 130, 132, 134, 136, 138 are mounted on a circuit board 118, with control signals and address signals for the memory devices being supplied through a bus 120. Inputs/outputs 1, 2, 3, 4 of each of the memory devices are connected to input/output lines D0–D8 of the circuit board 118 via pads R1–R33. Depending on which of the inputs/outputs 1,2,3,4 are failed, a working memory module may be constructed by selectively connecting the pads R1–R33. For example, when inputs/outputs 2, 3, 4 of memory device 130 are failed but input/output 1 is functional, input/output 1 of the device 130 can be routed to input/output D0 of the circuit board 118 by connecting the pad R1 to the input/output D0 and by disconnecting pads R2,R3, R5, R7, R6 and R8. Although this technique can produce a working memory module using partially failed devices, the circuit board generally has a complicated wiring pattern in order to accommodate many chips of various failure types. In addition, a significant amount of labor may be expended in selectively connecting the pads R1–R33, which can lead to increased production costs.

SUMMARY OF THE INVENTION

In light of the foregoing, it is an object of the present invention to provide memory modules, circuit substrates and methods of fabrication of memory modules which utilize partially failed memory devices.

It is another object of the present invention to provide memory modules, circuit substrates and methods of fabrication of memory modules which can provide reduced production costs in comparison to convention modules and module fabrication techniques.

These and other objects, features and advantages are provided according to the present invention by memory modules, circuit substrates and fabrication techniques therefor in which means are provided to selectively connect the memory cell array select lines of memory devices mounted on a circuit substrate such that only memory cell arrays having non-defective memory cells are accessible. In this fashion, reduced capacity memory modules may be fabricated from partially defective higher-capacity devices, thus reducing waste of devices with partial defects. Because a significant number of defective memory devices have only a few defective memory cells, the reduction in waste can be significant. The circuit cards and fabrication techniques according to the present invention require less complex connections that conventional modules, and thus can provide for reduced fabrication costs in comparison to conventional modules.

In particular, according to the present invention, a memory module includes a plurality of memory devices, each memory device including a plurality of memory cell arrays, a plurality of data input/output lines, and a memory cell array select input line. The plurality of memory cell arrays are arranged as a plurality of blocks such that data transfer is enabled between a memory cell array in each block of the plurality of blocks and a respective data input/output line of the plurality of data input/output lines when a predetermined voltage is applied to the memory cell array select input line. The module includes a circuit substrate on which the plurality of memory devices is mounted, the circuit substrate including first and second voltage busses. Means are provided for selectively connecting the memory cell array select input lines of the plurality of memory devices to the first and second voltage busses such that a predetermined voltage is applied to the memory cell array select input lines of the plurality of devices and data transfer is enabled between a selected memory cell array in each block of each memory device and a respective data input/output line of the memory device. Preferably, the selected memory cell arrays are free of defective memory cells, and memory devices of the plurality of memory devices have defective cells in memory cell arrays other than the selected memory cell arrays. The circuit substrate preferably includes a conductor which electrically connects the memory cell array select input lines of the plurality of memory devices, a first connection point connected to the conductor, a second connection point connected to the first voltage bus and a third connection point connected to the second voltage bus. The means for selectively connecting preferably includes means for selectively connecting the first, second and third connection points. The circuit substrate may also include an external select line, and the module may further include means for selectively connecting the memory cell array select input lines of the plurality of memory devices to the external select line.

In a first embodiment, each of the plurality of memory devices includes a 4 megabit (M)×4 bit memory device organized as four blocks of four 1M memory cell arrays, each memory device including four data input/output lines, ten memory cell address inputs, and two memory cell array select input lines, wherein data transfer is enabled between one memory cell array in each block of the four blocks and a respective one of the four data input/output lines when a predetermined set of voltages is applied to the two memory cell array select input lines. The means for selectively connecting includes means for selectively connecting the two memory cell array select input lines of the plurality of memory devices to the first and second voltage busses such that a predetermined set of voltages is applied to the two memory cell array select input lines and data transfer is enabled between a selected memory cell array in each block of the four blocks of each of the memory devices and a respective one of the four data input/output lines of the memory device, forming a 1M deep memory module.

In a second embodiment, each of the plurality of memory devices includes a 2M×8 bit memory device organized as eight blocks of two 1M memory cell arrays, each memory device including eight data input/output lines, eight memory cell address inputs, and one memory cell array select input line, wherein data transfer is enabled between one memory cell array in each block of the eight blocks and a respective one of the eight data input/output lines when a predetermined voltage is applied to the memory cell array select input line. The means for selectively connecting includes means for selectively connecting the memory cell array select input lines of the plurality of memory devices to the first and second voltage busses such that the predetermined voltage is applied to the memory cell array select input line and data transfer is enabled between a selected memory cell array in each block of the eight blocks of each of the memory devices and a respective one of the eight data input/output lines of the memory device, forming a 1M deep memory module.

A circuit substrate according to the present invention includes means for mounting a plurality of memory devices on the circuit substrate, first and second voltage busses, and means for selectively connecting the memory cell array select input lines of a plurality of memory devices mounted on the substrate to the first and second voltage busses. Preferably, the substrate includes a conductor which electrically connects the memory cell array select input lines of a plurality of memory devices mounted on the substrate, and the means for selectively connecting includes a first connection point connected to the conductor, a second connection point connected to the first voltage bus, and a third connection point connected to the second voltage bus, each of the connection points being operable for receiving a jumper. The substrate may also include an external address line and means for selectively connecting the memory cell array select input lines of a plurality of memory devices mounted on circuit substrate to the external address line.

According to a method aspect of the present invention, memory modules are fabricated by providing a plurality of memory devices, each memory device including a plurality of memory cell arrays, a plurality of data input/output lines and a memory cell array select input line, wherein the plurality of memory cell arrays are arranged as a plurality of blocks such that data transfer is enabled between one memory cell array in each block of the plurality of blocks and a respective data input/output line of the plurality of data input/output lines when a predetermined voltage is applied to the memory cell array select input line. The provided plurality of memory devices is mounted on a circuit substrate including first and second voltage busses, and the memory cell array select input lines of the plurality of memory devices are selectively connected to the voltage busses such that a predetermined voltage is applied to the memory cell array select input lines of the plurality of devices and data transfer is enabled between a selected memory cell array in each block of the plurality of blocks of each of the memory devices and a respective data input/output line of the plurality of data input/output lines of the memory device. The substrate preferably includes a first connection point for connecting to the memory cell array select input lines of a plurality of devices mounted on the substrate, a second connection point connected to the first voltage bus, and a third connection point connected to the second voltage bus, and the step of selectively connecting preferably includes the step of selectively connecting the first, second and third connection points.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
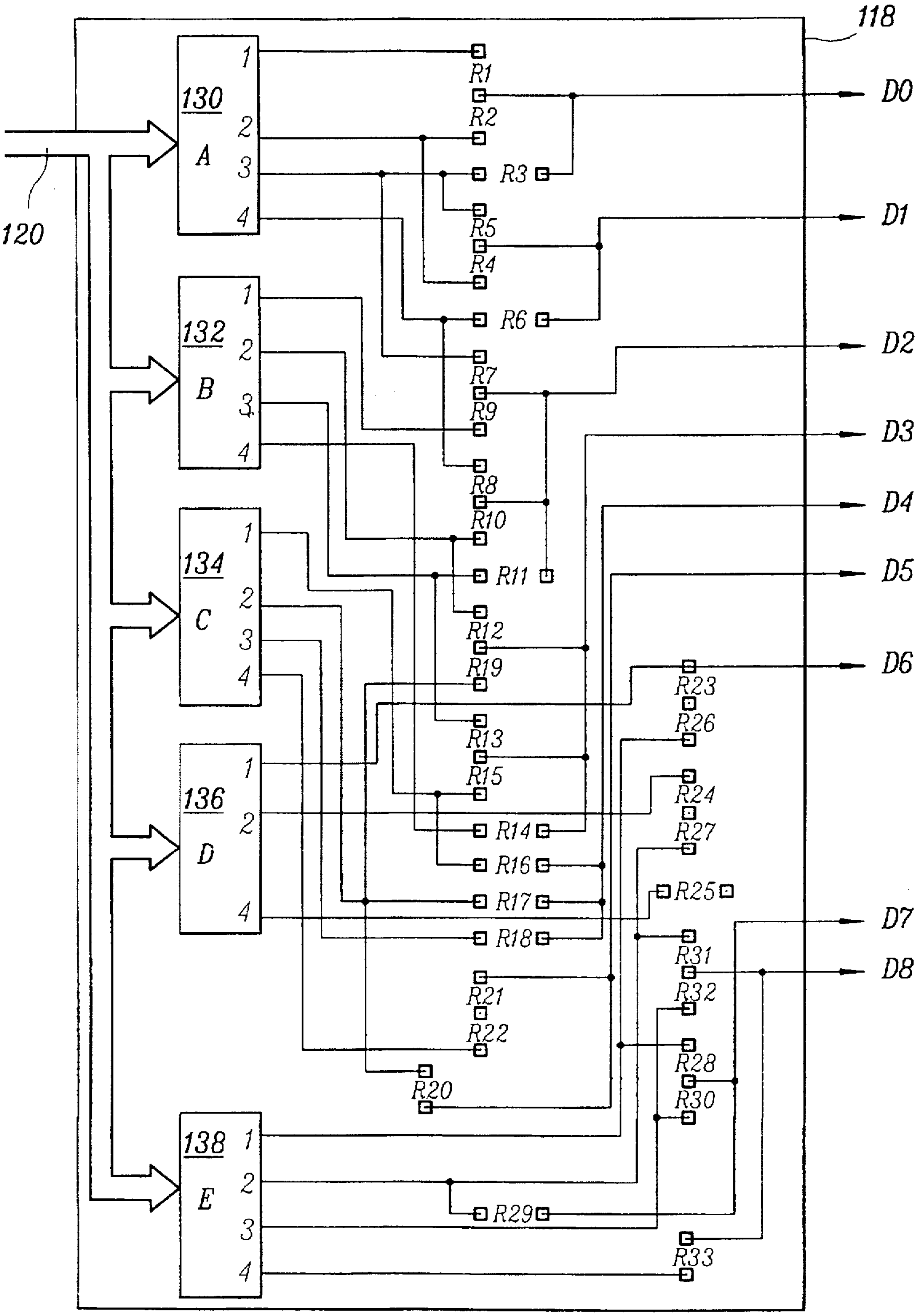
FIG. 1 is a schematic block diagram illustrating a memory module according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 2:
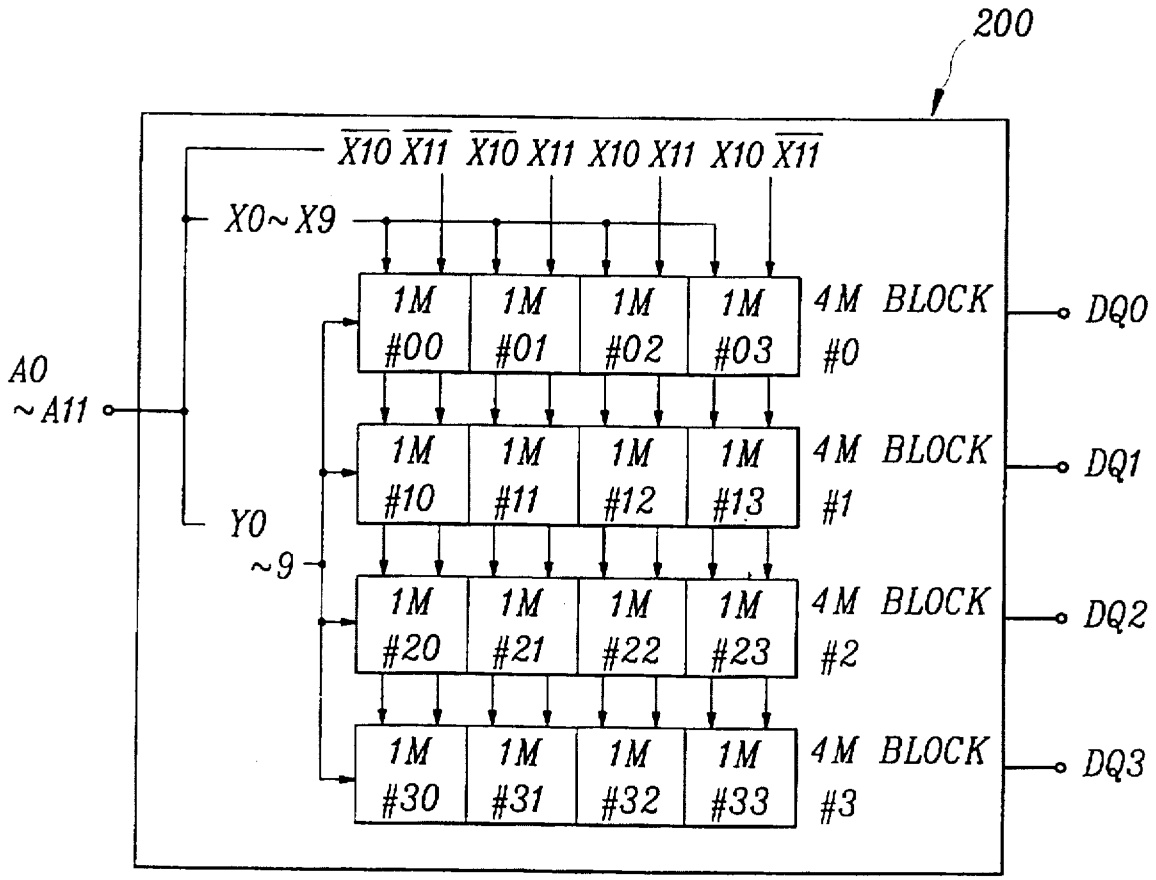
FIG. 2 is a schematic diagram illustrating a 4M×4 bit memory device.
Figure 3:
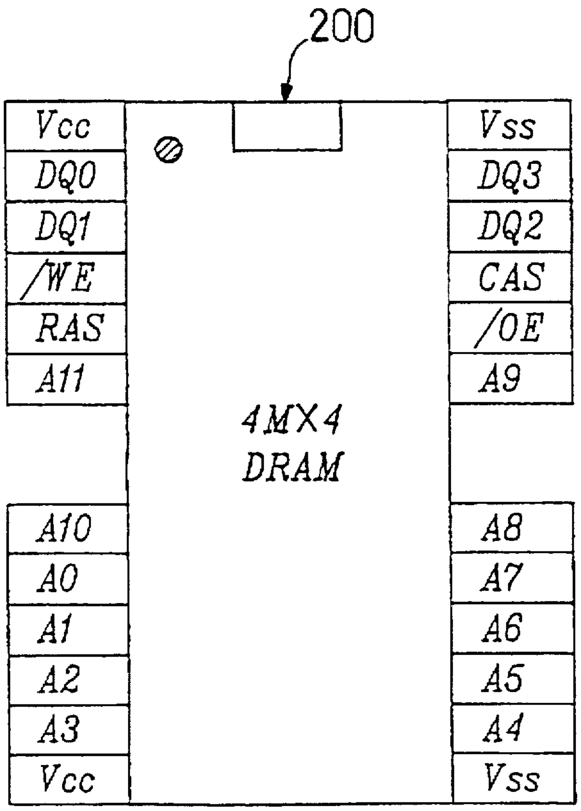
FIG. 3 illustrates a pinout for a 4M×4 bit memory device.

FIG. 2 shows the construction of a 16M DRAM device 200 including four 4M memory blocks #0–#3. A block #0 includes four 1M memory cell arrays #00–#03. The address lines A0–A11 are time-division-multiplexed into row addresses X0–X11 and column addresses Y0–Y11. The row addresses X0–X9 are connected to respective word lines of the 1024 word lines in each 1M array, while the remaining two memory cell array select lines X10–X11 are used in selecting one of the four 1M memory cell arrays in each block #0–#3. The column addresses Y0–Y9 are associated with the respective bit lines in each of the 1M memory cell arrays. FIG. 3 shows a pin configuration for the 16M DRAM device 200 of FIG. 2. Twelve address pins A0–A11 are provided, corresponding to the lines described in connection to FIG. 2. The functions of the other pins of the device 200, such the power supply lines Vcc,Vss, the write and output enable lines /WE, /OE, the row and column address strobe lines RAS,CAS, and the data input/output lines DQ0–DQ3, are well-known to those skilled in the art, and need not be discussed in further detail herein.

Figure 4:
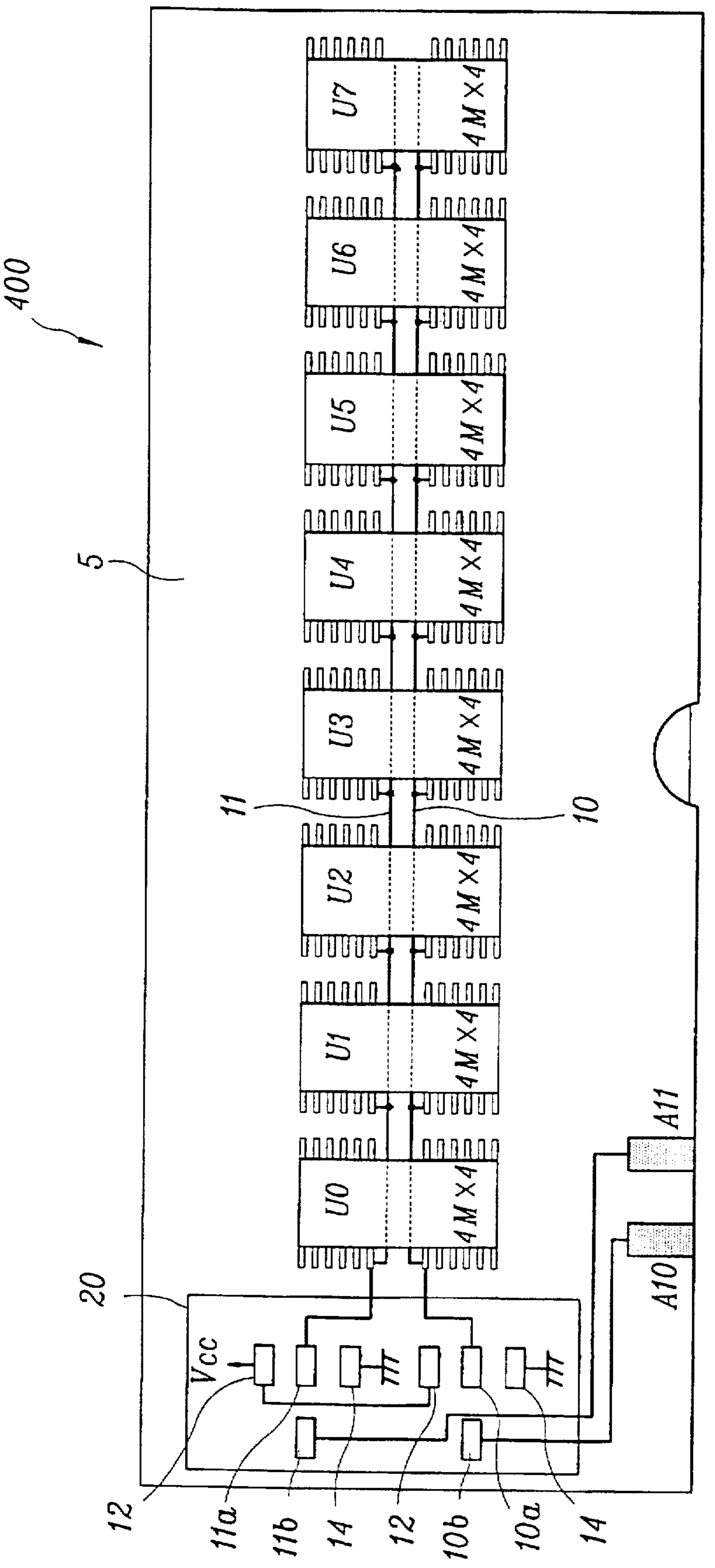
FIG. 4 illustrates a first embodiment of a memory module according to the present invention.

FIG. 4 is a schematic diagram of a 1M×32 bit memory module 400 according to the present invention, preferably a standard in-line memory module (SIMM) of the type commonly used for main random access memory in personal computers (PCs). The module 400 includes eight devices U0–U7 of the type described in reference to FIGS. 2 and 3, mounted on a circuit substrate 5. The circuit substrate 5 includes an option pad 20 including a first connection point 10*a* connected to first memory cell array select lines A10 of the devices U0–U7 via conductor 10, a second connection point 11*a* connected to second memory cell select lines A11 of the devices U0–U7 via conductor 11, third connection points 12 connected to a first voltage bus VCC, and fourth connection points 14 connected to a second voltage bus GND. Also shown are additional connection points 10*b*,11*b* connected to circuit substrate external address lines A10', A11'. For simplicity of illustration, additional address lines and input/output lines on the circuit substrate 5, connected to the address lines A0–A9 and input/output lines DQ0–DQ3 of the devices U0–U7, are not illustrated, but will be understood by those skilled in the art.

When first and second connection points 10*a*, 11*a* are connected to additional connection points 10*b*, 11*b*, address signals provided at external address lines A10', A11' are input to each 16M device, thus enabling full access to all of the memory cell arrays of the devices U0–U7. However, the third and fourth connection points 12, 14 may be used to provide a reduced-capacity memory module if some of the memory cells in the devices U0–U7 are defective, by connecting the memory cell array select lines A10, A11 of the devices U0–U7 such that only non-defective memory cell arrays are accessible. If, for example, one of the memory cell arrays in each block of the devices U0–U7 is non-defective, for example, the memory cell arrays #00, #10, #20 and #30, the first and second connection points 10*a*, 11*a* may be connected to fourth connection points 12, i.e., grounded, such that only these memory cell arrays will be accessible. In this manner, a 1M deep memory module may be formed. The connection points thus provide means for selectively connecting the memory cell array select lines of the device U0–U7. The selective connection may be implemented using by any number of mechanisms, for example, by soldering a jumper wire or other conductor between the connection points. Other selective connecting means may be used according to the present invention, including, for example, pins, posts or similar apparatus connected by an external clip or similar device, fusible links, removable conductor traces on the substrate 5, selectable switches, and the like.

According to the present invention, 4M×4 bit DRAMs which have been identified as having defective memory cells may be sorted depending on which memory cell arrays in the devices have defective memory cells. 16M DRAMs having non-defective 1M memory cell arrays with the same block address can be grouped on a circuit substrate and connected as described above. The circuit substrate 5 can also be pre-configured and appropriate memory devices, i.e., memory devices with the appropriate non-defective memory cell arrays, selected for installation on the pre-configured substrate.

Figure 5:
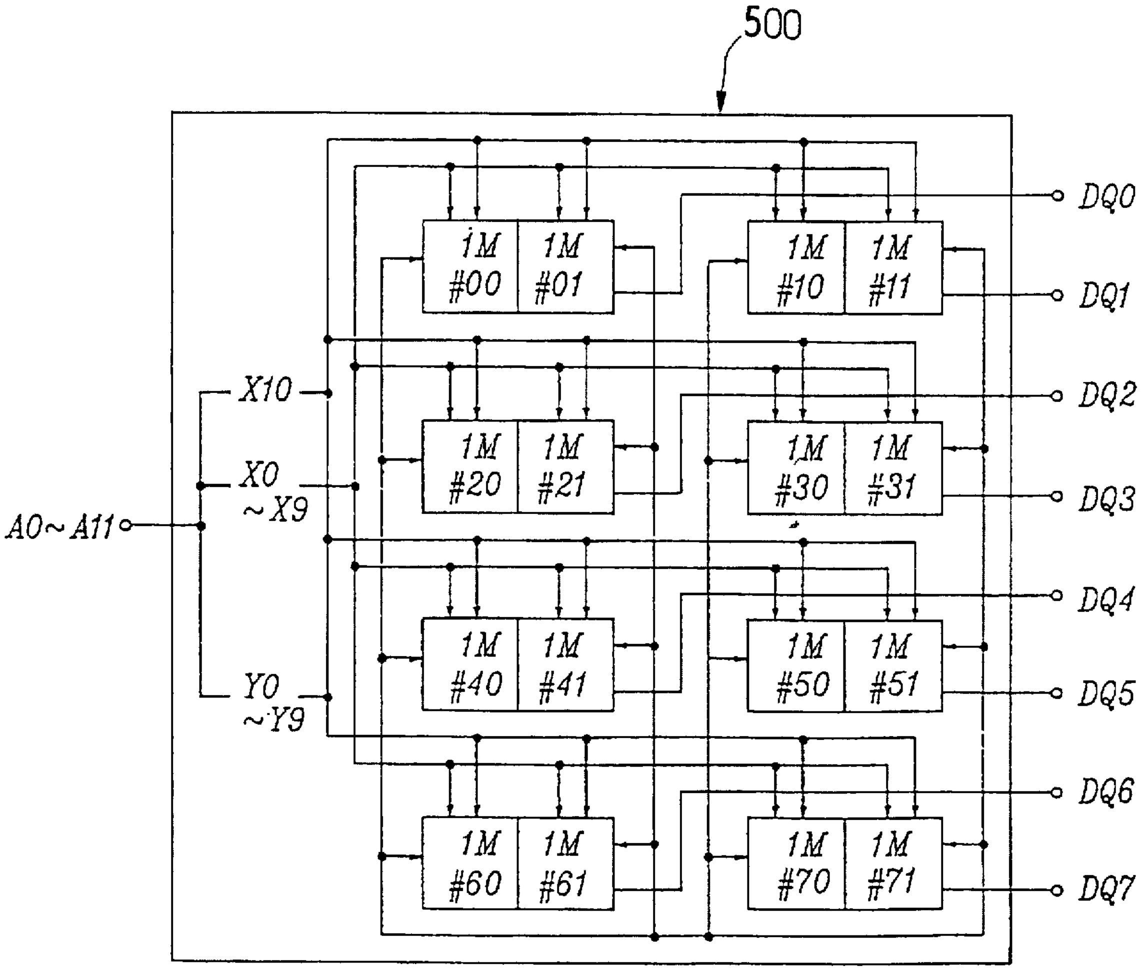
FIG. 5 is a schematic diagram illustrating a 2M×8 bit memory device.

FIG. 5 illustrates a conventional 2M×8 bit DRAM 500, including a plurality of memory cells grouped into eight 2M memory blocks, and each of 2M blocks including two 1M memory arrays #00/#01–#70/#71. Address lines A0–A11 are for providing memory cell addresses via row and column addresses X0–X9,Y0–Y9 and for selecting the memory cell arrays via memory cell array select line X10. Data transfer between the memory cell arrays is enabled by operation of memory cell array select line A10, which selects which memory cell array in each block is connected to the data input/output lines DQ0–DQ8. For example, to select memory cell array #00, a "0" binary value is applied to the memory cell array select line A10, while to select memory cell array #01, a binary value of "1" is applied to memory cell array select line A10.

Figure 6:
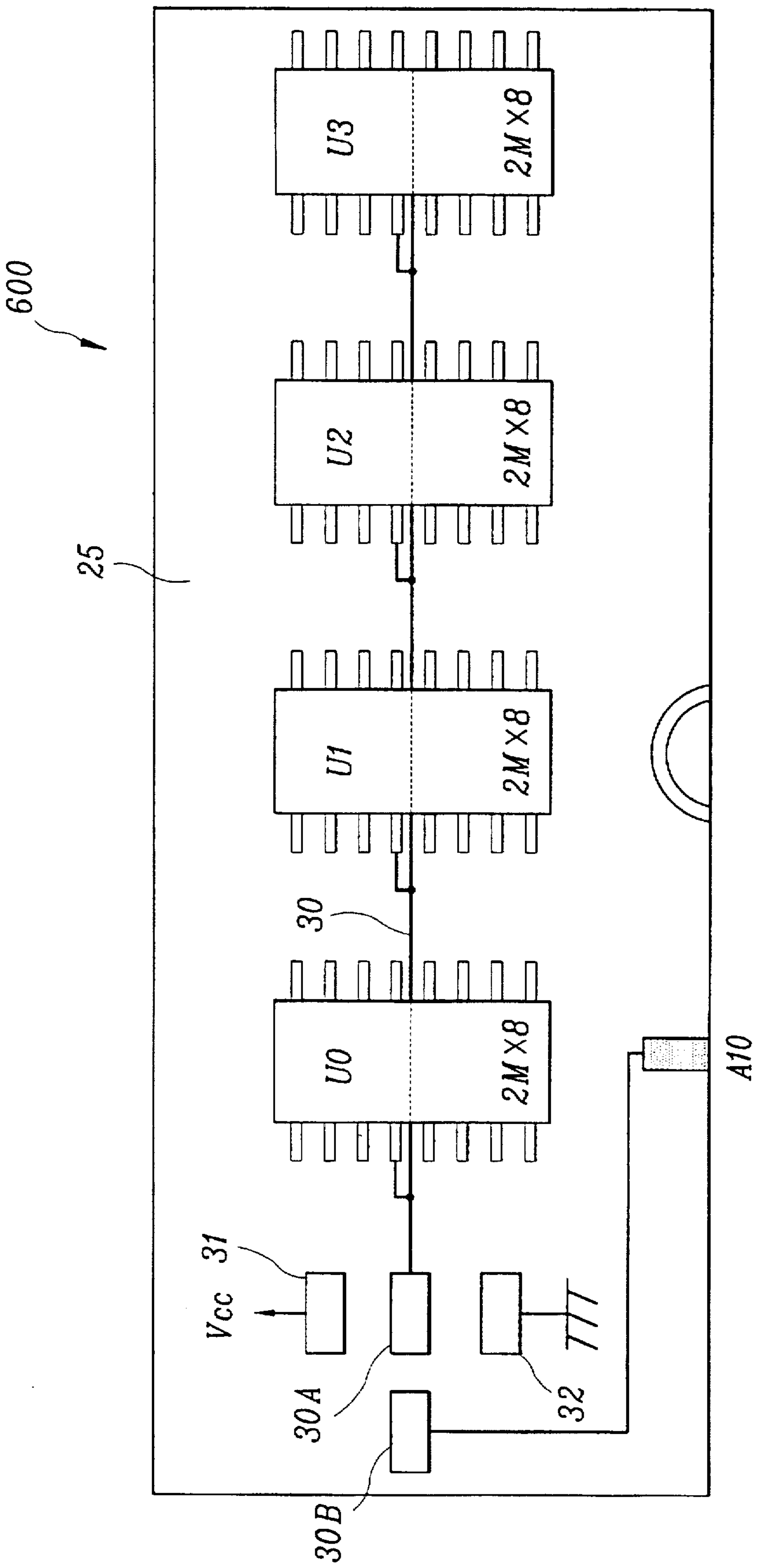
FIG. 6 illustrates a second embodiment of a memory module according to the present invention.

FIG. 6 shows another embodiment of a memory module 600 according to the present invention, in which 2M×8 bit memory devices U0–U3 are mounted on a circuit substrate 25 and memory cell array select lines A10 of the device U0–U3 are commonly connected by a conductor 30, and the conductor 30 is connected to a first connection point 30A. The first connection point 30A may be jumpered to a voltage bus, e.g., VCC or GND, via corresponding second and third connection points 31,32. When the memory devices U0–U3 have defective memory cell arrays selected by a "0" on the memory cell array select line A10, the first connection point 30A should be jumpered to the second connection point 31 corresponding to VCC so that only the memory cell arrays selected by a "1" at the memory cell array select line A10 are accessible. In this manner a 1M deep memory module is provided.

Although, the illustrated embodiments of the present invention utilize 16M DRAMs, the present invention is also applicable to other size DRAM devices. For example, those skilled in the art will appreciate that 16M and 32M deep memory modules can similarly be provided by using partially defective 64M DRAMs.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A memory module, comprising:

a plurality of memory devices, each memory device including:
  a plurality of memory cell arrays;
  a plurality of data input/output lines; and
  a memory cell array select input line, wherein said plurality of memory cell arrays are arranged as a plurality of blocks such that data transfer is enabled between one memory cell array in each block of said plurality of blocks and a respective data input/output line of said plurality of data input/output lines when a predetermined voltage is applied to said memory cell array select input line;

a circuit substrate on which said plurality of memory devices is mounted, said circuit substrate including a first voltage bus and a second voltage bus; and means for selectively connecting the memory cell array select input lines of said plurality of memory devices to one of said first and second voltage busses such that a predetermined voltage is applied to said memory cell array select input lines of said plurality of devices and data transfer is enabled between a selected memory cell array in each block of each memory device and a respective data input/output line of the memory device.

2. A memory module according to claim 1, wherein said selected memory cell arrays are free of defective memory cells.

3. A memory module according to claim 1, wherein memory devices of said plurality of memory devices have defective cells in memory cell arrays other than said selected memory cell arrays.

4. A memory module according to claim 1:

wherein said circuit substrate further comprises:

a conductor which electrically connects said memory cell array select input lines of said plurality of memory devices;

a first connection point connected to said conductor;

a second connection point connected to said first voltage bus; and a third connection point connected to said second voltage bus; and wherein said means for selectively connecting comprises means for selectively connecting said first, second and third connection points.

5. A memory module according to claim 1:

wherein each of said plurality of memory devices comprises a 4 megabit (M)×4 bit memory device organized as four blocks of four 1M memory cell arrays, each memory device including four data input/output lines, ten memory cell address inputs, and two memory cell array select input lines, and wherein data transfer is enabled between one memory cell array in each block of said four blocks and a respective one of said four data input/output lines when a predetermined set of voltages is applied to said two memory cell array select input lines; and wherein said means for selectively connecting comprises means for selectively connecting said two memory cell array select input lines of said plurality of memory devices to said first and second voltage busses such that a predetermined set of voltages is applied to said two memory cell array select input lines and data transfer is enabled between a selected memory cell array in each block of said four blocks of each of said memory devices and a respective one of said four data input/output lines of the memory device, forming a 1M deep memory module.

6. A memory module according to claim 1:

wherein each of said plurality of memory devices comprises an 2M×8 bit memory device organized as eight blocks of two 1M memory cell arrays, each memory device including eight data input/output lines, eight memory cell address inputs, and one memory cell array select input line, and wherein data transfer is enabled between one memory cell array in each block of said eight blocks and a respective one of said eight data input/output lines when a predetermined voltage is applied to said memory cell array select input line; and wherein said means for selectively connecting comprises means for selectively connecting said memory cell array select input lines of said plurality of memory devices to said first and second voltage busses such that a predetermined voltage is applied to said memory cell array select input line and data transfer is enabled between a selected memory cell array in each block of said eight blocks of each of said memory devices and a respective one of said eight data input/output lines of the memory device, forming a 1M deep memory module.

7. A memory module according to claim 1, wherein said circuit substrate further comprises an external select line, and wherein the module further comprises means for selectively connecting the memory cell array select input lines of said plurality of memory devices to said external select line.

8. A circuit substrate for mounting a plurality of memory devices to form a memory module, each memory device including a plurality of memory cell arrays, each including a plurality of memory cells, a plurality of data input/output lines, and a memory cell array select input line, wherein the plurality of memory cell arrays are arranged as a plurality of blocks such that data transfer is enabled between one memory cell array in each block of the plurality of blocks and a respective data input/output line of the plurality of data input/output lines when a predetermined voltage is applied to the memory cell array select input line, the circuit substrate comprising:

a substrate;

means for mounting a plurality of memory devices on the substrate;

a first voltage bus positioned on the substrate;

a second voltage bus positioned on the substrate; and means for selectively connecting the memory cell array select input lines of a plurality of memory devices mounted on the substrate to one of said first and second voltage busses.

9. A circuit substrate according to claim 8, further comprising a conductor which electrically connects the memory cell array select input lines of a plurality of memory devices mounted on the substrate, and wherein said means for selectively connecting comprises:

a first connection point connected to said conductor, said first connection point being operable for receiving a jumper; and a second connection point connected to said first voltage bus, said second connection point being operable for receiving a jumper; and a third connection point connected to said second voltage bus, said third connection point being operable for receiving a jumper.

10. A circuit substrate according to claim 9, further comprising an external address line, and means for selectively connecting the memory cell array select input lines of a plurality of memory devices mounted on said circuit substrate to said external address line.

11. A circuit substrate according to claim 8, further comprising an external address line and means for selectively connecting the memory cell array select input lines of the plurality of memory devices mounted on circuit substrate to said external address line.

12. A method of fabricating memory modules, the method comprising the steps of:

providing a plurality of memory devices, each memory device including a plurality of memory cell arrays, a plurality of data input/output lines, and a memory cell array select input line, wherein the plurality of memory cell arrays are arranged as a plurality of blocks such that data transfer is enabled between one memory cell array in each block of the plurality of blocks and a respective data input/output line of the plurality of data input/output lines when a predetermined voltage is applied to the memory cell array select input line;

mounting the provided plurality of memory devices on a circuit substrate including a first voltage bus and a second voltage bus; and selectively connecting the memory cell array select input lines of the plurality of memory devices to one of the first and second voltage busses such that a predetermined voltage is applied to the memory cell array select input lines of the plurality of devices and data transfer is enabled between a selected memory cell array in each block of the plurality of blocks of each of the memory devices and a respective data input/output line of the plurality of data input/output lines of the memory device.

13. A method according to claim 12, wherein the circuit substrate includes a first connection point for connecting to the memory cell array select input lines of a plurality of devices mounted on the substrate, a second connection point connected to the first voltage bus, a third connection point connected to the second voltage bus, and wherein said step of selectively connecting comprises the step of selectively connecting the first, second and third connection points.

14. A method according to claim 13:

wherein each of the provided plurality of memory devices comprises a 4 megabit (M)×4 bit memory device organized as four blocks of four 1M memory cell arrays, each memory device including four data input/output lines, ten memory cell address inputs, and two memory cell array select input lines, and wherein data transfer is enabled between one memory cell array in each block of the four blocks and a respective one of the four data input/output lines when a predetermined set of voltages is applied to the two memory cell array select input lines; and wherein said step of selectively connecting comprises the step of selectively connecting the first, second, and third connection points such that a predetermined set of voltages is applied to the two memory cell array select input lines and data transfer is enabled between a selected memory cell array in each block of the four blocks of each of the memory devices and a respective one of the four data input/output lines of the memory device, to thereby form a 1M deep memory module.

15. A method according to claim 13:

wherein each of the provided plurality of memory devices comprises an 2M×8 bit memory device organized as eight blocks of two 1M memory cell arrays, each memory device including eight data input/output lines, eight memory cell address inputs, and one memory cell array select input line, and wherein data transfer is enabled between one memory cell array in each block of the eight blocks and a respective one of the eight data input/output lines when a predetermined voltage is applied to the memory cell array select input line; and wherein said step of selectively connecting comprises the step of selectively connecting the first, second and third connection points such that a predetermined voltage is applied to the memory cell array select input lines and data transfer is enabled between a selected memory cell array in each block of the eight blocks in each of the memory devices and a respective one of the eight data input/output lines of the memory device, to thereby form a 1M deep memory module.

16. A method according to claim 12, wherein said selected memory cell arrays are free of defective memory cells.

17. A method according to claim 12, wherein memory devices of said provided plurality of memory devices have defective cells in memory cell arrays other than said selected memory cell arrays.

* * * * *